United States Patent [19]
Avery et al.

[11] Patent Number: 5,881,453
[45] Date of Patent: Mar. 16, 1999

[54] METHOD FOR MOUNTING SURFACE MOUNT DEVICES TO A CIRCUIT BOARD

[75] Inventors: William J. Avery; John S. Suy; David M. Tichane, all of San Jose, Calif.

[73] Assignee: Tandem Computers, Incorporated, Cupertino, Calif.

[21] Appl. No.: 845,856

[22] Filed: Apr. 24, 1997

Related U.S. Application Data

[63] Continuation of Ser. No. 245,260, May 17, 1994, abandoned.

[51] Int. Cl.$^6$ ............................. H05K 13/04; H05K 3/32
[52] U.S. Cl. ................. 29/834; 29/759; 29/760; 29/836; 439/72; 439/73; 439/331
[58] Field of Search ............................ 29/740, 759, 760, 29/834, 836, 840, 842; 269/903; 439/68, 70, 72, 73, 331

[56] References Cited

U.S. PATENT DOCUMENTS

| | | | |
|---|---|---|---|
| 3,874,768 | 4/1975 | Cutchaw | 339/17 |
| 4,254,447 | 3/1981 | Griffis | 361/386 |
| 4,390,220 | 6/1983 | Benasutti | 439/331 X |
| 4,461,524 | 7/1984 | McGhee | 439/331 X |
| 4,468,074 | 8/1984 | Gordon | 339/75 |
| 4,547,031 | 10/1985 | Korsunsky | 439/331 X |
| 4,744,009 | 5/1988 | Grabbe et al. | 439/72 X |
| 4,787,443 | 11/1988 | Fukatsu et al. | 165/165 |
| 4,797,996 | 1/1989 | Lobry et al. | 29/759 X |
| 4,812,949 | 3/1989 | Fontan et al. | 361/386 |
| 4,854,377 | 8/1989 | Komoto et al. | 165/80.4 |
| 4,893,403 | 1/1990 | Heflinger et al. . | |
| 4,933,808 | 6/1990 | Horton et al. | 361/336 |
| 4,936,784 | 6/1990 | Saito | 439/72 |

(List continued on next page.)

FOREIGN PATENT DOCUMENTS

| WO-A- | | | |
|---|---|---|---|
| 8402249 | 6/1984 | European Pat. Off. ....... | H05K 13/04 |
| 4329280 | 11/1992 | Japan | 439/331 |

OTHER PUBLICATIONS

IBM Technical Disclosure Bulletin, vol. 36, No. 10, Oct. 1993, p. 289.

Simpson, Scott; Chapter "Connector Design," pp. 13.1–13.44, Digital Bus Handbook, Joseph DiGiacomo, Editor, McGraw–Hill 1990.

Mitsubishi Electric, "Surface Mounting Methods," Mitsubishi Semiconductors 1990 IC Packages Databook, pp. 2–53 et sqq.

National Semiconductor Corporation, "Small Outline (SO) Package Surface Mounting Methods–Parameters and Their Effect on Product Reliability," Interface Databook, 1986, pp. 9–29 to 9–37.

(List continued on next page.)

*Primary Examiner*—Peter Vo
*Attorney, Agent, or Firm*—Townsend and Townsend and Crew LLP

[57] ABSTRACT

Disclosed is method for aligning and mounting electrical components, such as packaged integrated circuits, to a printed circuit board. During an alignment phase, a sample component is attached to a stand-in circuit board at a component site. A base plate, having alignment elements, is then fitted to the board proximate the attached sample component. Next, a chuck is mounted to the sample component, and an alignment plate positioned to engage the alignment elements of the base plate, and affixed to the chuck, forming a chuck assembly that is aligned to the base plate and registered to the component site of the circuit board. During a production phase, the base plate is placed on a printed circuit board at a location substantially identical to that on the stand-in printed circuit board. A chuck assembly, configured substantially identical to that formed during the alignment phase, and carrying a component to be mounted, is attached to the base plate so that the alignment plate engages the alignment elements. The chuck, carrying the electrical component is registered to the base plate through the alignment plate to accurately locate the component leads over the circuit pads on the circuit board.

7 Claims, 2 Drawing Sheets

U.S. PATENT DOCUMENTS

| | | | |
|---|---|---|---|
| 4,943,468 | 7/1990 | Gordon et al. | 428/210 |
| 4,974,119 | 11/1990 | Martin | 361/386 |
| 5,006,962 | 4/1991 | Haley | 361/417 |
| 5,014,777 | 5/1991 | Sano | 165/185 |
| 5,041,695 | 8/1991 | Olenick et al. | 174/52.4 |
| 5,088,930 | 2/1992 | Murphy | 439/70 |
| 5,132,875 | 7/1992 | Plesinger | 361/386 |
| 5,165,986 | 11/1992 | Gardner et al. | 428/209 |
| 5,175,410 | 12/1992 | Freedman et al. | 219/121.63 |
| 5,177,844 | 1/1993 | Swift | 29/740 X |
| 5,231,753 | 8/1993 | Tanaka et al. | 29/741 |
| 5,232,372 | 8/1993 | Bradley et al. | 29/834 X |
| 5,267,867 | 12/1993 | Agahdel et al. | 439/73 |
| 5,276,961 | 1/1994 | Matta et al. | 29/827 |
| 5,311,060 | 5/1994 | Rostoker et al. | 257/796 |
| 5,332,463 | 7/1994 | Eberlein et al. | 156/556 |
| 5,339,215 | 8/1994 | Nishiguichi | 361/704 |
| 5,344,334 | 9/1994 | Lamb et al. | 439/73 X |
| 5,365,402 | 11/1994 | Hatada et al. | 361/699 |

OTHER PUBLICATIONS

St. Lawrence, M.E. & Simpson, S.S., "A High Density LGA Connector for MCMs," Connection Technology, Jun. 1991, pp. 40–43.

Hawker, Dennis, "Scott Simpson Technical Background and Achievements," Memorandum, Apr. 19, 1994.

International Electronics Packaging Society, Membership Notice, Undated.

Avery, Bill, "Ice Project—Socketing Applications," Memorandum, Apr. 11, 1994.

Ando, Hitoshi and Creighton, Nick, "Unique Applications for New Low Resistance Elastomeric Connectors" (undated, Shin–Etsu publication), pp. 931–944, et. sqq.

METHOD FOR MOUNTING SURFACE MOUNT DEVICES TO A CIRCUIT BOARD

This is a Continuation of application Ser. No. 08/245,260, filed May, 17, 1994, now abandoned.

REFERENCE TO RELATED APPLICATIONS

This application is related to the following commonly-assigned applications filed concurrently herewith:

| TITLE | SER. NO. |
| --- | --- |
| APPARATUS FOR MOUNTING SURFACE MOUNT DEVICES TO A CIRCUIT BOARD | 08/245,497 now U.S. Pat. No. 5,504,980; |
| HEAT CONDUCTIVE APPARATUS FOR ENCAPSULATED ELECTRICAL COMPONENTS | 08/245.490 now pending; and |
| APPARATUS FOR COOLING A PLURALITY OF ELECTRICAL COMPONENTS | 08/245,296 now U.S. Pat. No. 5,615,086 |

BACKGROUND OF THE INVENTION

The present invention is directed generally to attaching electrical components to printed circuit boards. The invention relates more particularly to removably affixing surface mount integrated circuit packages with splayed leads to printed circuit boards, wire boards, or wire assemblies.

An integrated circuit combines numerous active and passive electrical circuitry elements on a single device called a die or chip. Commonly, the electronics industry, including the computer, communications, and consumer electronics sub-industries, interconnect integrated circuits by attaching them to printed circuit boards. Because chips are inherently small and fragile devices, they are usually imbedded in a substrate called a chip carrier or package before they are attached to the printed circuit board. Protruding from the package are a number of electrical conducting leads. The manner in which the leads protrude vary; they may extend through the bottom of the package (e.g. pin or pad grid arrays), they may be arrayed along two edges of the package (e.g. dual in-line pins), or they may fan out from the edges of the package (e.g. gull wing and J pins).

The wiring on printed circuit boards comprises thin metallic strips embedded in an insulating material. These strips interconnect leads protruding from one integrated circuit package to leads protruding from other circuit packages mounted on the same board. To make all the required connections, the boards typically have several layers of interconnect wiring. The wiring determines the placement of the integrated circuit packages on the board and routes electrical signals among the integrated circuits. Leads may connect to the wiring in a variety of ways. One method involves drilling holes in the board and through the wiring at appropriate locations, inserting leads through the holes, and making mechanical and electrical attachments among the leads, the wiring, and the holes. Another, increasing popular technique, is called surface mount technology. This method involves arranging contact pads on the surface of the printed circuit board. The pads provide paths for electrical signals from leads to the appropriate embedded wires. Leads are placed on top of the pads and mechanically and electrically attached.

There are a number of methods of mechanically and electrically attaching integrated circuit package leads to printed circuit boards. The most commonly used techniques in the electronics industry require lead based solder. There are many environmental and economic disadvantages in using solder:

Lead is a well known hazardous material linked to numerous serious human ailments. While there is no evidence that lead in electrical solder has an impact on worker health or the environment, both the Environmental Protection Agency and members of Congress have expressed concern. Industry research in this area is ongoing.

Depositing lead onto printed circuit boards often requires fluxes which must be cleansed. The preferred method of cleansing involves freon which is known to persist for long periods in the atmosphere and is known to deplete ozone. Other methods of cleansing boards involve using water which creates problems of treating waste water to eliminate pollutants.

The heat required to deposit solder on boards may damage the components being attached or the board itself.

Repairing a board or component requires reheating which may cause further damage and require scrapping an expensive assembly.

Equipment to mass produce soldered boards (e.g. wave solder and flux cleansing machines) is expensive and cumbersome.

Metal solders frequently short (or bridge) leads to one another, adversely alter the electrical characteristics of integrated circuits (e.g. increasing capacitance between leads), limit how closely leads may be spaced (thus limiting the density of integrated circuits on a board), and result in defective connections (e.g. cold solder joints) which may be difficult or impossible to detect before a board is placed in service.

Soldered bonds between boards and components may be broken when the board is dropped, flexed, or otherwise vibrated.

Many soldered assemblies require gold connections instead of less expensive metals with superior or nearly equivalent electrical properties (i.e. silver, copper, and aluminum), because of gold's thermal expansion and anticorrosive properties.

Surface mount technologies generally involve applying a 3- to 4-mil coating of solder paste onto contact pads on the surface of the board, placing package leads onto the pads, and melting (reflowing) the solder. This is sufficient mechanically to hold the package in place while making the proper electrical connection. Surface mounting has a number of advantages over older techniques; it saves board space by permitting dies to be mounted in small packages with closely spaced leads, it reduces the number of levels of embedded wires in a board, and it allows components to be mounted on both sides of a board. However, surface mount technology not only entails the known problem of using solder, but also raises the additional problem of properly aligning the leads onto the contact pads. Proper placement of surface mount components generally requires specialized computer controlled equipment.

Because of the advantages of surface mount technology, much research has been directed at the soldering and alignment problems. Two alternatives to soldering are the subject of most research; attaching packages to boards with adhesive (e.g. TAB technology) or applying sufficient pressure to packages to make a mechanical and electrical connection. Proper placement of components for TAB and pressure mount techniques has proved to be as difficult a problem as it is for solder techniques.

Most pressure techniques involve compressing the package itself to the board. A compressible pad with embedded electrically conductive material, known as a Z-axis connector, is frequently placed between the package and the board. Usually only leadless packages with contact pads on the bottom surface may be used; pressure on the top of a package would stress the point at which splayed leads, such as gull wings, attach to the package. In any event, applying pressure to the top of any package sufficient to maintain a proper electrical connection between the leads and the board contact pads, may damage the package.

OBJECTS AND SUMMARY OF THE INVENTION

Accordingly, it is an object of the present invention to provide a less complex method for aligning surface mount electrical components to a printed circuit board. In addition, it is an object of the present invention to provide an method for removably mounting surface mount components, without using solder, to printed circuit boards.

Broadly, the invention comprises a base plate mounted on a circuit board proximate to and in registered relation with a component site formed on the circuit board and defined by a number of connection pads at which an electrical component is to installed. A chuck assembly, configured to receive and carry the electronic component, is affixed to the base plate in a manner that aligns and registers the electrical component to the chuck assembly and to the base plate, and thereby to the site in a manner that locates electrical leads (connections) of the electrical component in electrical contact relation to corresponding ones of pads of the component site.

In a one embodiment of the invention, the base plate is an annular structure mounted on the circuit board in proximate relation to the component site. Formed in an upper surface of the base plate are recesses configured to receive the terminal ends of an elongate alignment plate that forms a part of the chuck assembly. A chuck unit, configured to capture and hold the electrical component to be mounted, is attached to the alignment plate at a location that accurately positions the chuck unit, and the electrical component it carries, relative to the base plate, and thereby relative to the component site, aligning corresponding ones of the electrical component leads and site pads.

Alignment of the chuck unit is accomplished by first placing the base plate on a representative or "stand-in" circuit board proximate component site at which a sample component is installed by conventional methods. The chuck unit is fitted to the sample component, the alignment plate mounted to the base plate so that it is in juxtaposed relation to the chuck unit, and the chuck unit affixed to the alignment plate. The placement of the base plate, relative to the circuit board, is noted. The chuck assembly, comprising the alignment plate and now-fastened chuck unit, is removed, as is the sample component. The electrical component can now replace the sample component in the chuck assembly, and the chuck assembly (now carrying the electrical component) remounted to the base-plate. The alignment originally established prior to affixing the chuck unit to the alignment plate to form the chuck assembly is maintained to align the electrical leads of the electrical component to the component site pads.

This alignment procedure accurately registers the base plate to the pads that define component site of the printed circuit board. The registration is noted, and used when forming production forms of the printed circuit board for placement of a base plate on each printed circuit board so produced, locating the base plate in registration with the component site. A component can the be mounted to the component site with pin/pad registration when installed with the chuck assembly to the base plate.

For purposes of mass production, the alignment plate and chuck assembly, as created during the alignment stage, may be used as a model for creating a mold or for defining milling specifications. Then identical assemblies may be created for the production stage. If a set of identical base plates, a set of identical printed circuit boards, and a set of specifications for precisely registering the base plates to the circuit boards exist, then any number of identical circuit boards with mated electrical components may be created.

The base plate itself may comprise any one of a number of convenient embodiments. For example, the circuit board itself could be molded with an upturned perimeter having slots. This would substitute for the separate base plate.

Optionally, electrically conductive adhesive material may be placed between the electrical components' leads and the pads on the circuit board. When the alignment plate and chuck assembly is removed (and optionally the base plate as well), the electrical components will remain attached to the circuit board in precise alignment.

Alternatively, a thin elastomer material containing Z-axis connectors is placed between the pin leads and the electrical pads. This material serves several functions. First, it prevents the pin leads from scrubbing and abrading the pads thus allowing the components to be mated and demated repeatedly without significant damage to the circuit board. Second, the elasticity of the material provides a compressibility which damps external shocks and vibrations, reducing the possibility of loss of electrical connection between the pin leads and the pads. Third, the material, because of its elastic property, compresses slightly under the pin leads when force is applied to the chuck. This compression is sufficient to form a gas or fluid tight seal around the base of the chuck.

The above, and other objects, features and advantages of the present invention will become apparent from the following description read in conjunction with the accompanying drawings, in which like reference numerals designate the same elements.

DESCRIPTION OF THE PREFERRED EMBODIMENT

The present invention may be used to mount a variety of electrical or electronic components to circuit boards (or comparable elements), but has particular application to mounting surface mount technology (SMT) devices of the type having gull wing or "J" connector leads, such as illustrated in the figures. (Unless otherwise noted, the term "lead" is used herein to refer to the portion of an electrical or electronic component through which an electrical connection is made between the component and a circuit board or other component. It will be obvious to those skilled in this art the examples of lead configurations include, in addition to the to the gull wing or J leads illustrated in the Figures (e.g., FIG. 2), dual inline pins, pin grid arrays, and pad grid arrays.) As indicated above, certain prior art mounting methods for circuit components rely upon pressure applied directly to the device itself (or, more accurately to the carrier which houses the chip or electronic component of the device). This can tend to impose stresses sufficient to fracture the device, leading to device failure. The present invention operates to capture and hold only the leads of the device.

Figure 1:
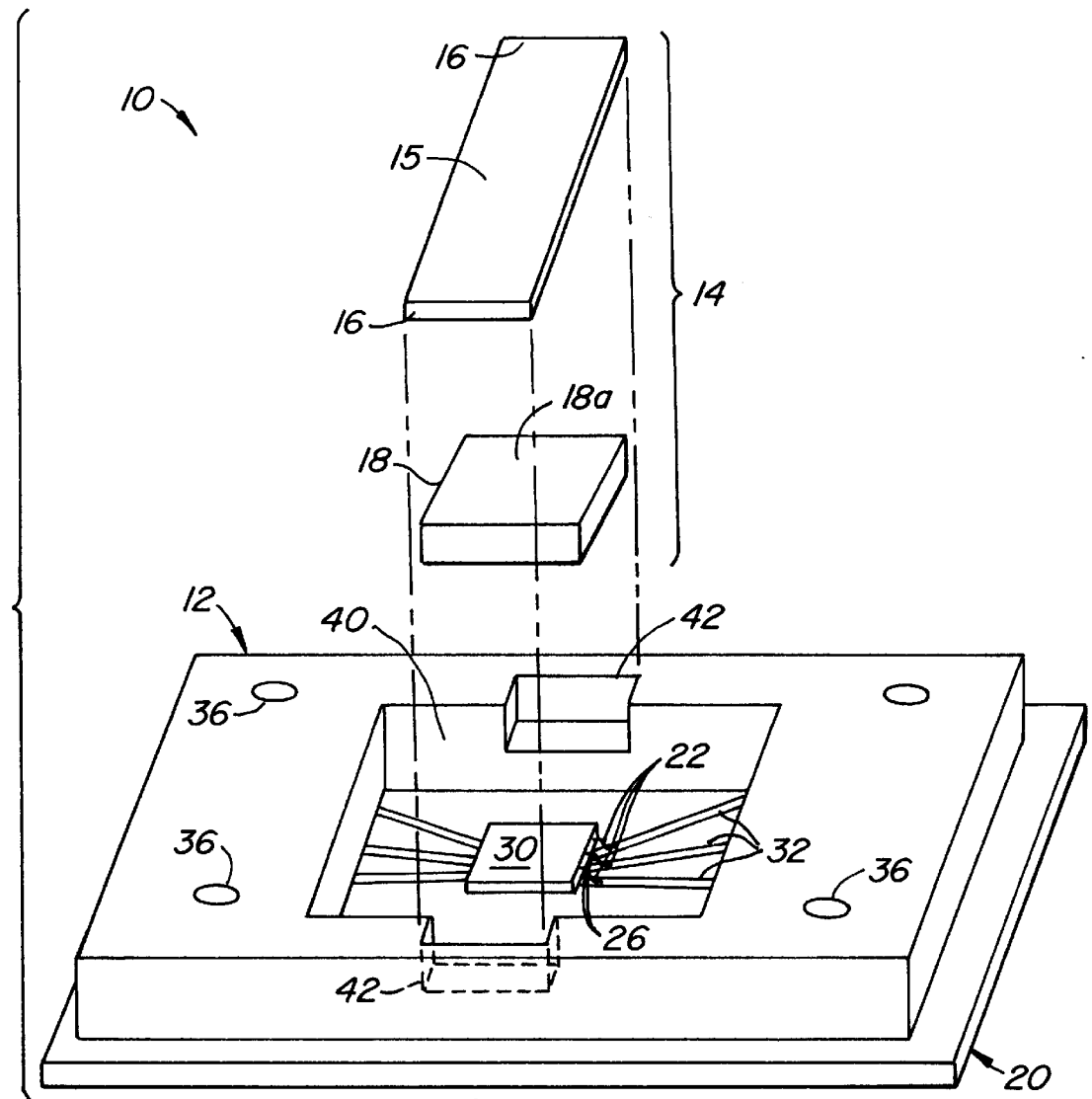
FIG. 1 is an exploded perspective view of an alignment device constructed according to the present invention.
Figure 2:
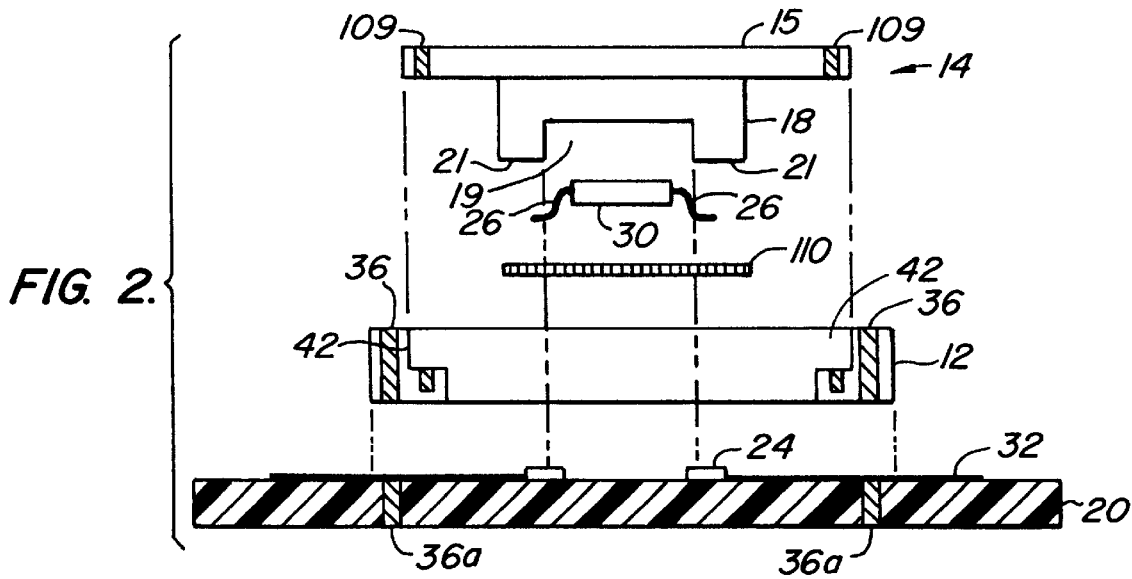
FIG. 2 is an exploded cross-sectional view of the relative position of assembly components in the production process.
Figure 3:
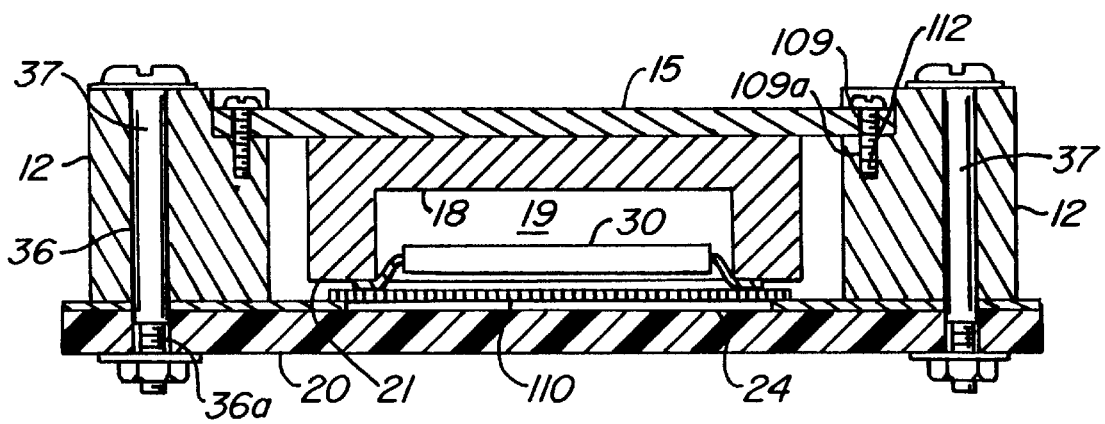
FIG. 3 is a cross-sectional view of assembled device of FIG. 1.

Turning now to FIGS. 1–3, one embodiment of the mounting method of the present invention, designated generally by the reference numeral 10 is illustrated. As FIG. 1 shows, the mounting apparatus 10, comprising a base plate 12 and chuck assembly 14 (shown here in exploded fashion), is installed on a surface of a circuit board 20, proximate a SMT connection site 22. The SMT connection site 22 of the circuit board 20 is conventional in the sense that it is defined by a number of conductive pads 24 that are oriented to receive and connect to corresponding ones of leads 26 of an engineering sample SMT device 30 placed thereat. The pads 24, in turn, connect to circuit traces 32 formed on the circuit board 20 for communicating signals to other devices or components (not shown) that may be also mounted on the circuit board 20.

The base plate 12 is formed with alignment holes 36 that align with underlying apertures 36a (FIG. 2) formed in the circuit board 20 to register the base plate 12 to the SMT connection site 22. A central opening 40 is formed in the base plate 12 so that, when mounted to the circuit board 20, access to the SMT connection site 22 is provided therethrough. The central opening 40 of the base plate 12 has alignment slots 42 formed in opposing wall portions thereof for receiving the terminal ends 16 of an alignment plate 15 that forms a part of the chuck assembly 14. The dimensions of the alignment slots 42, together with those of the alignment plate 15 (or, at least the terminal ends 16 of the alignment plate 15), are such that minimal, if any, movement (lateral or longitudinal) is permitted the alignment plate 15 while so installed on the base plate 12.

The chuck assembly 14 includes, in addition to the alignment plate 15, a chuck 18, having a recess 19 formed in an undersurface thereof (FIGS. 2 and 3). The configuration and dimensions of the recess 19 are such that it can snugly receive and hold the sample device 30. As shown, the sample device 30 has J or gull wing leads; however, as indicated above, the present invention may be used with any type of SMT device lead. Here, the recess 19 formed in the chuck 18 is sized to capture the SMT device 30 by the leads; and the bottom peripheral surface 21 of the chuck 18 captures the lateral-extending terminal portions of the SMT device leads 26 between the peripheral surface 21 and the pads 24 of the circuit board 20. It will be evident, however, that if the sample SMT device 30 uses other types of connective leads (e.g., those that linearly extend laterally away from the carrier itself, or those that use a pin array protrusion-type leads formed on the underside of the sample SMT device 30), the recess 19 would be configured to snugly receive the periphery of the chip carrier that forms the sample SMT device 30.

The chuck 18 is affixed to the alignment plate 15, forming the chuck assembly 14. An alignment process locates the chuck 18 on the alignment plate 15 so that, when the completed chuck assembly 14 is mounted to the base plate 12 with the alignment slots 42 receiving the terminal ends 16 of the alignment plate 15, the recess 19 (and the SMT device 30 it holds) will be substantially registered to the SMT connection site 22. This registration also places the leads 26 of the SMT device 30 in substantial alignment with the pads 24, to be held thereagainst in place by the bottom peripheral surface 21 of the chuck 18 for electrical mating. The alignment process establishes the location and position of the chuck 18 relative to the base plate 12 through the alignment plate 15. The base plate 12, in turn, is registered to the SMT connection site 22 of the circuit board 20 by alignment of the alignment holes 36 formed in the base plate 12 with the alignment holes 36a formed in the circuit board 20. Thereby, any SMT device carried by the chuck assembly 14 is registered to the SMT connection site 22 for electrical connective engagement of the SMT device leads with corresponding pads 24 when the chuck assembly 14 is mounted to the base plate 12.

The alignment process used to register the chuck 18 to the base plate 12, and thereby to the SMT connection site 22, is as follows. Referring to FIGS. 2 and 3, a sample SMT device 30 is first conventionally mounted td the circuit board 20 (e.g., by wave-soldering, adhesive, or any other technique customarily used to affix SMT devices to circuit boards) with the leads of the sample SMT device 30 in contact with the corresponding pads 24 that form and define the SMT connection site 22. The base plate 12 is attached to the circuit board in proximate relation to the SMT connection site 22 by alignment of attachment holes 36 with corresponding attachment holes 36a formed in the circuit board 20 (and a bolt 37 or other attachment mechanism inserted therethrough). Alternatively, the base plate 12 may be adhesively attached to the circuit board 20, using other techniques to maintain registration. It will soon be evident that in this alignment process that no particular relative relation between the base plate 12 and the SMT connection site 22 is initially necessary other than that site 22 be accessible to the chuck assembly 14 through the central opening 40 of the base plate 12. Also, the base plate 12 should be mounted to the circuit board 20 to that a center line extending between the two alignment slots 42 pass over (or at least proximate) the SMT connection site 22 for reasons that will understood below. However, once registration is established between the chuck 18 and the SMT connection site 22 (through the alignment plate 15, base plate 12 and aligned holes 36, 36a) the relative location and position of the base plate 12 with the SMT connection site 22 must be maintained.

The chuck 15 is then inserted through the central opening of the base plate 40, fitted over the sample device 30 so that the sample device 30 seats in the recess 19. An adhesive is spread over the top surface 18a of the chuck 18, and the alignment plate 15 is placed in alignment slots 42 of the base plate 12. The dimensions of the alignment plate 15, the chuck 18, and the alignment slots 42 are such the underside of the alignment plate 15 contacts the top surface 18a of the chuck 18, allowing the adhesive to bind the two together, forming the chuck assembly 14. Further, it can now be seen why the placement of the base plate 12 should be such that a center line extending between the alignment slots pass at least near the SMT connection site 22.

At this point, the alignment process is complete. The chuck 18, now forming a part of the chuck assembly 14, is now registered to the SMT connection site 22.

The present invention may now be used in a manufacturing environment. Here, production versions of the circuit board 20 are provided, identical to that used to align and register the chuck 15 to the SMT connection site 22, including of course the SMT connection site 22 and alignment apertures 36a formed therein to align with the apertures 36 formed in the base plate 12. Further, these alignment apertures 36a formed in production versions of the circuit board 20 should positioned relative to the SMT connection site substantially identical to those formed on the circuit board 20 used in the alignment process, so that when a base plate 12 is installed thereon, and its apertures 36 aligned with those (36a) of the production version of circuit board 20, the base plate 12 will be registered to the SMT connection site 22 of the production circuit board 20 substantially identical to the registration of the base plate 12 to the SMT connection site 22 of circuit board 20 used in the alignment process.

Thus, as illustrated in FIG. 2 and 3, mounting the SMT device 30' on a production version of the circuit board 20 (with an empty SMT connection site 22) merely requires the base plate 12 to be attached by bolts 37 inserted through the attachment holes 36 and aligned attachment holes 36a of the production version of the circuit board 20. So attached, the base plate 12 is registered to the SMT connection site 22 of the production version circuit board 20 in the same manner as it was in the alignment process. An SMT device 30' is fitted to the chuck assembly 14 so that it seats in, and is held by, the recess 19 of the chuck 15. The terminal ends 16 of the alignment plate 15 of the chuck assembly 14 are then inserted into alignment slots 42 and attached to the base plate 12. For this purpose attachment holes 109 (FIGS. 2 and 3) and attachment receiving holes 109a are respectively formed in the chuck assembly and the base plate to receive screws or bolts 112 (FIG. 3) to hold the chuck assembly 14 in place to the base plate 12. As FIGS. 2 and 3 illustrate, the laterally extending terminal portions of the leads 26 emanating from the SMT device 30 are captured and held between the bottom peripheral surface 21 of the chuck 18 and pads 24 of the circuit board 20.

The leads 26 of the SMT device 30 may make direct contact with the pads 24. Optionally, however, as shown in FIGS. 2 and 3, a Z-axis connector 110 may be placed between leads 26 and circuit pads 24. Thereby, the SMT device leads 26 are kept in mechanical and electrical connection by the attachment of the chuck assembly 14 to the base plate 12, and the attachment of the base plate 12 to the production version of the circuit board 20. One advantage of using Z-axis connector 110 is that the chuck assembly 14 containing the SMT device 30 may be mounted and demounted repeatedly with minimum wear on circuit pads 24. If the Z-axis connector 110 is omitted, the mechanical and electrical connection may be still maintained, but repeated removal and insertion of the SMT device can act to abrade and score the pads 24 and/or SMT device leads.

Other connection options include using electrically conductive solder or adhesive instead of pressure. The chuck assembly 14 and the base plate 12 would be employed as previously indicated to align and register the SMT device 30 to its proper position relative to the SMT connection site 22 on the circuit board 20. However, the solder or adhesive is spread between the leads 26 and the circuit pads 24 before they are forced into electrical contact. In the preferred embodiment, the circuit board 20 and the SMT device 30 then are tested for electrical and mechanical faults. If the combination fails any of the tests, the chuck assembly 14 containing the SMT device 30 is demated from the base plate 12 and the problem is corrected before the combination is mated again. Once the combination passes the tests, the solder is melted or the adhesive is activated. The chuck assembly 14 and the base plate 12 may then be removed from the production circuit board 20 leaving the SMT device 30 mounted in its proper location.

Figure 4:
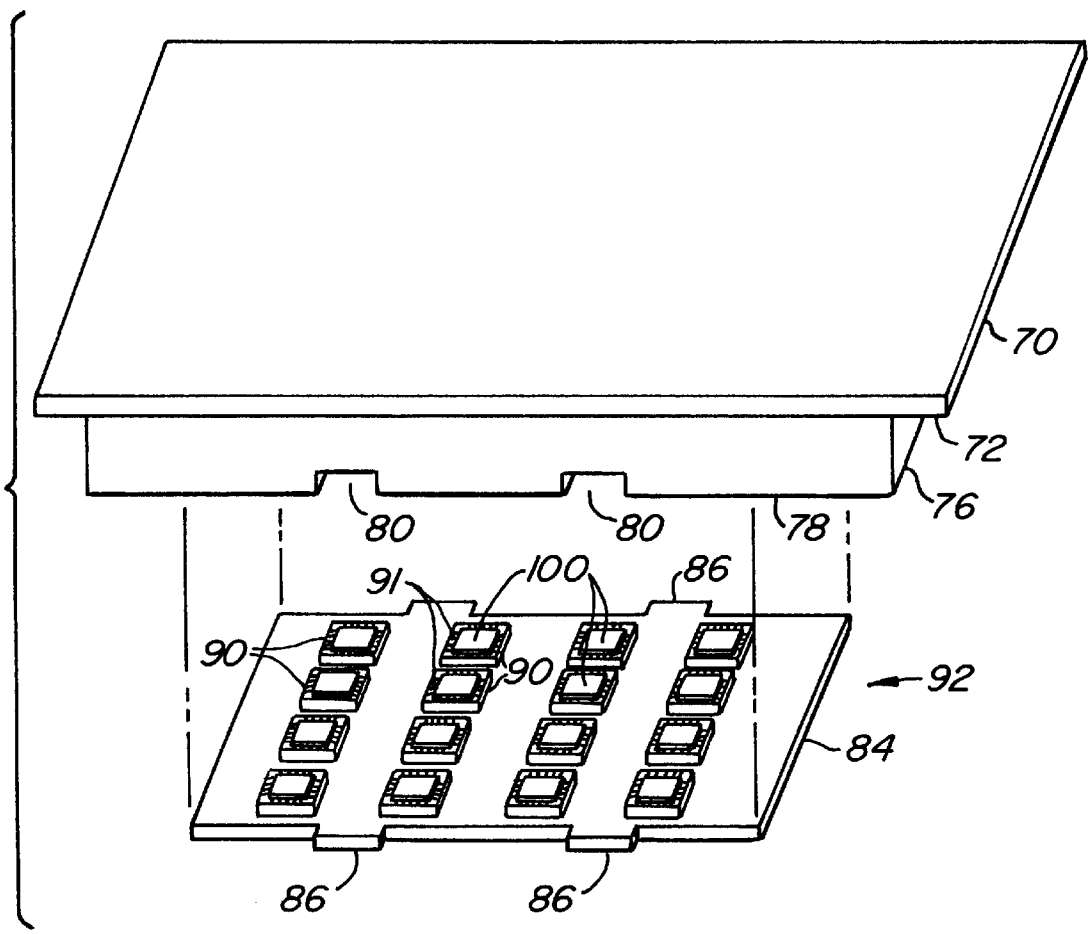
FIG. 4 is an upside-down perspective view of a number of assembled devices, including their relative positions as mounted on an alignment plate, and the relative position of the alignment plate to a base plate and printed circuit board.

The foregoing discussion has taught a method and apparatus for mounting a single SMT device to a circuit board. It should be evident to those skilled in the art that the invention can be extended to mounting multiple SMT devices. Thus, referring now to FIG. 4, a method and apparatus for mounting multiple SMT devices is illustrated. As FIG. 4 shows, a circuit board 70, having a plurality of SMT connector sites (not shown) formed on a planar surface 72 of the circuit board 70. Affixed to the circuit board 70, such as discussed above, with alignment holes and bolts, or by an adhesive, or any other attachment technique, is a base plate 76 that encircles the SMT connection sites (not shown) on the circuit board 70. The base plate 76 has formed, in opposing wall portions 78 (only one of which can be seen in FIG. 4) alignment elements in the form of notches 80.

A broad, planar alignment plate 84 is formed and configured with alignment tabs 86 to mount to the base plate 76 so that the alignment tabs 86 engage notches 80 to register the alignment plate 84 to the base plate 76.

The alignment phase is essentially the same as that described with respect to mounting a single SMT device. First, a "stand-in" circuit board is used, having SMT devices mounted at the SMT connection sites formed on the circuit board. Chucks 90 are configured with recesses 92 to be fitted over the mounted sample SMT devices, and the alignment plate 84 mounted to the base plate 76 and affixed to the chucks 90, forming a chuck assembly 92. The individual chucks 90 are now registered to the SMT connection sites through the alignment plate 84, base plate 76, and its placement on the circuit board 72.

As above, production models of the circuit board 72, identically structured and configured to that used during the alignment process, including placement of the SMT connection sites (not shown) and the installation of the base plate 70, can now be produced. Similarly, production models of the chuck assembly 92, with the chucks 90 oriented according to the alignment process and affixed to the alignment plate 84 are provided. Assembly merely required installing in each of the chuck assembly 90s a production version of the SMT devices 100 so that they are fitted into and captured by the recesses 91 of the chucks 90. The chuck assembly 92 is then installed on the base plate 76 with the tabs 86 received in the notches or grooves 80, thereby registering the SMT devices 100 to the SMT connection sites formed on the surface 72 of the circuit board 70 through (1) orientation and placement of the chucks 90 on the alignment plate 84, (2) registration of the alignment plate 84 to the circuit board 72 through (3) the base plate 76.

Although the present invention has been described with reference to specific embodiments thereof, numerous modifications can be readily implemented without departing from the spirit and scope of this invention.

What is claimed is:

1. A method of aligning a production electrical component having leads on a production circuit board having a first surface on which are exposed electrical pads comprising the steps:

providing a stand-in circuit board of substantially identical construction as the production circuit board, the stand-in circuit board having a first surface on which is an area defined by a number of connection pads in same locations respective to the stand-in circuit board as the electrical pads are to the production circuit board;

affixing a sample component of substantially identical construction as the production electrical component to the number of connection pads at the area on the first surface of the stand-in circuit board;

affixing a first base plate on the stand-in circuit board at a position proximate the area;

providing a first chuck having a top surface and a bottom surface;

fitting the bottom surface of the first chuck to the sample component;

fitting an alignment plate onto the first base plate so that the top surface of the first chuck contacts the alignment plate;

attaching the first chuck to the alignment plate to form a first chuck assembly;

affixing a second base plate of substantially identical construction to the first base plate on the first surface of the production circuit board to the position of the first base plate on the stand-in circuit board;

fitting the production electrical component to the bottom surface of a second chuck of a second chuck assembly of substantially identical construction as the first chuck assembly;

positioning second the chuck assembly, containing the production electrical component, to the second base plate on the production circuit board such that the production electrical component is registered to the connection pads of the production circuit board as the sample component was to the stand-in circuit board;

whereby the second chuck assembly places the leads on the production electrical component in electrical contact with the exposed electrical pads on the first surface of the production circuit board.

2. The method of claim 1 wherein a Z-axis connector is positioned between the leads and the pads for establishing electrical connection.

3. The method of claim 1 wherein electrically conductive adhesive is positioned between the leads and the pads.

4. The method of claim 3 comprising the additional step of removing the second chuck assembly leaving the components in electrical contact with the production circuit board.

5. The method of claim 1 wherein electrically conductive solder is melted between the leads and the pads.

6. The method of claim 5 comprising the additional step of removing the second chuck assembly leaving the electrical component in electrical contact with the production circuit board.

7. The method of claim 1, wherein the step of affixing the second chuck assembly places the leads on the production electrical component in physical contact with respective electrical pads on the first surface of the production circuit board.

* * * * *